United States Patent
Ramakrishnan (10) Patent No.: US 11,430,821 B2
(45) Date of Patent: Aug. 30, 2022

(54) IMAGE SENSOR WITH ACTIVE CLAMP TO SUPPRESS TRANSFER GATE FEEDTHROUGH

(71) Applicant: SEMICONDUCTOR COMPONENTS INDUSTRIES, LLC, Phoenix, AZ (US)

(72) Inventor: Shankar Ramakrishnan, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 52 days.

(21) Appl. No.: 17/247,288

(22) Filed: Dec. 7, 2020

(65) Prior Publication Data
US 2022/0181368 A1 Jun. 9, 2022

(51) Int. Cl.
*H01L 27/146* (2006.01)
*H04N 5/378* (2011.01)
*H04N 5/365* (2011.01)

(52) U.S. Cl.
CPC .. *H01L 27/14612* (2013.01); *H01L 27/14643* (2013.01); *H04N 5/3658* (2013.01); *H04N 5/378* (2013.01)

(58) Field of Classification Search
CPC ........ H01L 27/14612; H01L 27/14643; H04N 5/3658; H04N 5/378
See application file for complete search history.

(56) References Cited

U.S. PATENT DOCUMENTS

| | | | |
|---|---|---|---|
| 7,825,967 B2 | 11/2010 | Panicacci | |
| 10,290,673 B1* | 5/2019 | Wang | ................. H04N 5/23241 |
| 10,523,885 B2 | 12/2019 | Saha | |
| 11,233,959 B2* | 1/2022 | Sekine | ............... H04N 5/37457 |
| 2004/0155973 A1 | 8/2004 | Bea | |
| 2007/0241258 A1 | 10/2007 | Altice | |
| 2008/0210848 A1 | 9/2008 | Purcell | |
| 2017/0118430 A1* | 4/2017 | Koifman | ................. H04N 5/378 |
| 2020/0145596 A1* | 5/2020 | Mudegowdar | ......... H04N 5/376 |
| 2020/0244907 A1* | 7/2020 | Ueno | ................... H04N 5/3651 |
| 2020/0260035 A1* | 8/2020 | Luong | .................. H04N 5/3745 |
| 2020/0322558 A1* | 10/2020 | Lim | ....................... H04N 3/155 |

* cited by examiner

*Primary Examiner* — Shahbaz Nazrul
(74) *Attorney, Agent, or Firm* — Treyz Law Group, P.C.; Jason Tsai (57) ABSTRACT

An image sensor may include an array of image pixels arranged in rows and columns. Each column of pixels may be coupled to current source transistors and active clamping circuitry. The active clamping circuitry may be configured to sample a reset voltage and to selectively pull down the column line after a charge transfer operation if the column line exceeds the previously sampled reset voltage. The active clamping circuitry can reduce settling time during low light conditions while eliminate column fixed pattern noise.

20 Claims, 7 Drawing Sheets

IMAGE SENSOR WITH ACTIVE CLAMP TO SUPPRESS TRANSFER GATE FEEDTHROUGH

BACKGROUND

This relates generally to imaging devices and more particularly, to image sensors with charge transfer gates.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion node via a transfer gate. The floating diffusion node is coupled to a pixel output column line via a source follower transistor. Row control circuitry is coupled to each pixel row for resetting, initiating charge transfer, or selectively activating a particular row of pixels for readout.

When the transfer gate is activated, the floating diffusion node will be pulled up due to the transfer gate's parasitic capacitance, which causes the source follower output to go high by a similar amount. After the transfer gate is deactivated, even though the floating diffusion node can quickly return to the original or negative value depending on the amount of charge transferred from the photodiode, the pixel output column line can take a long time to recover from the positive pulse of the transfer gate due to the large amount of capacitance on the pixel output column line. This can dramatically limit the performance of the image sensor in low light conditions.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
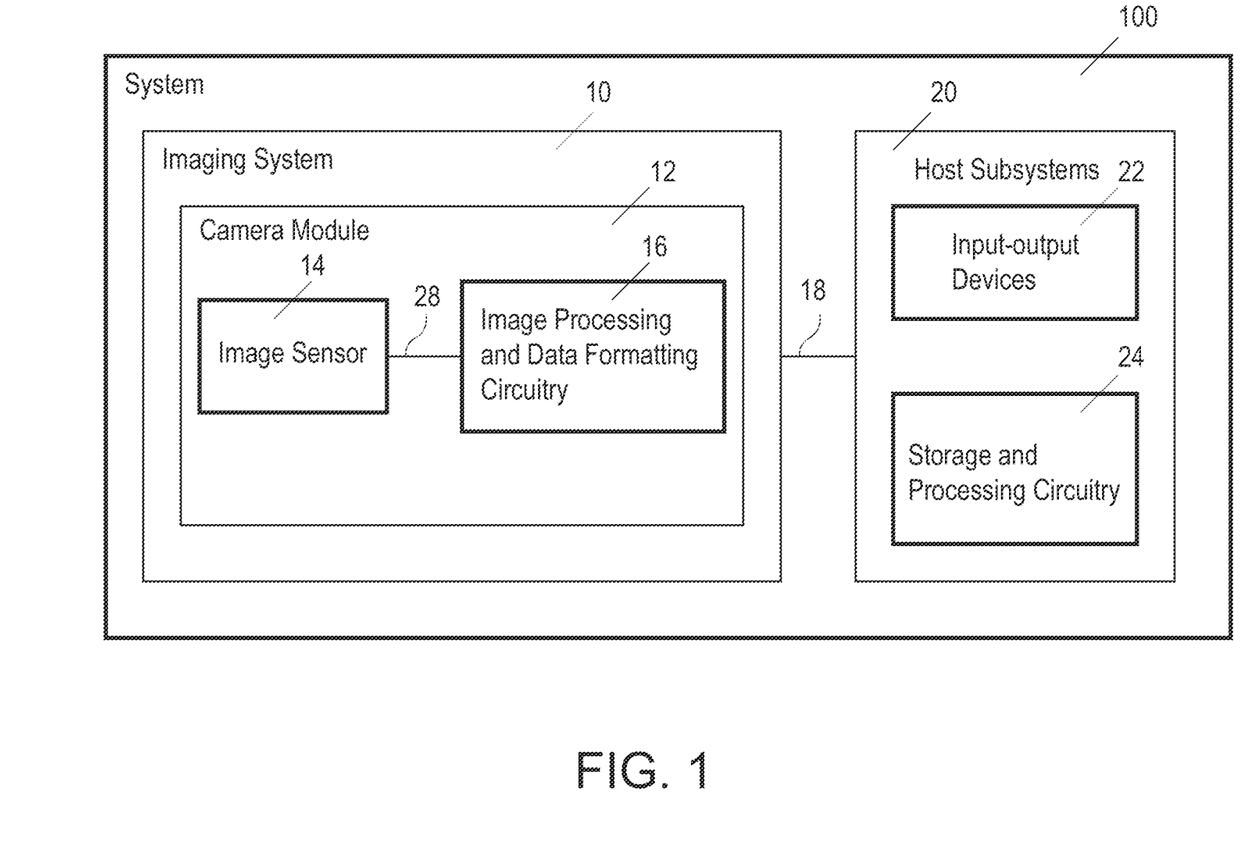
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
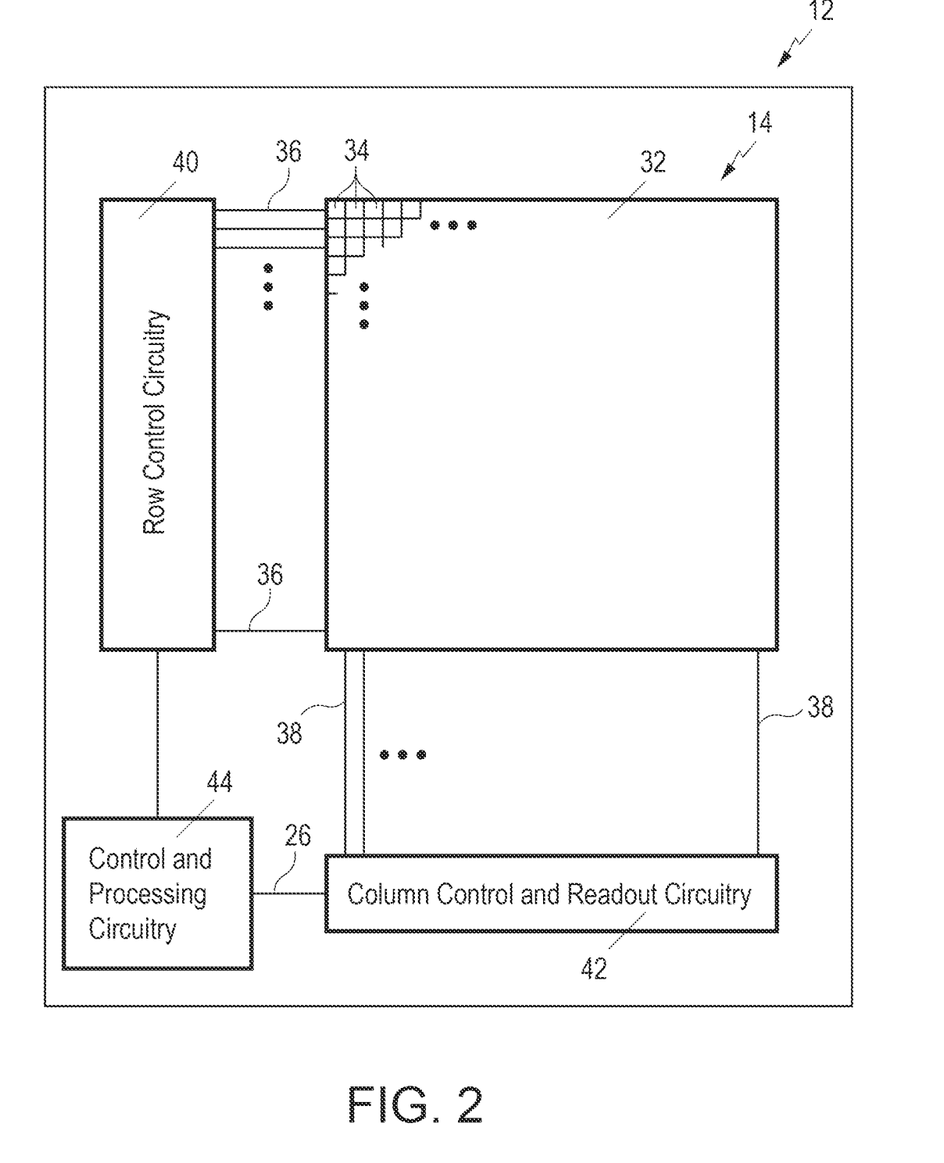
FIG. 2 is a diagram of an illustrative pixel array and associated row and column control circuitry for reading out image signals from an image sensor in accordance with some embodiments.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may sometimes be considered part of image processing and data formatting circuitry 16 in FIG. 1. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Figure 3:
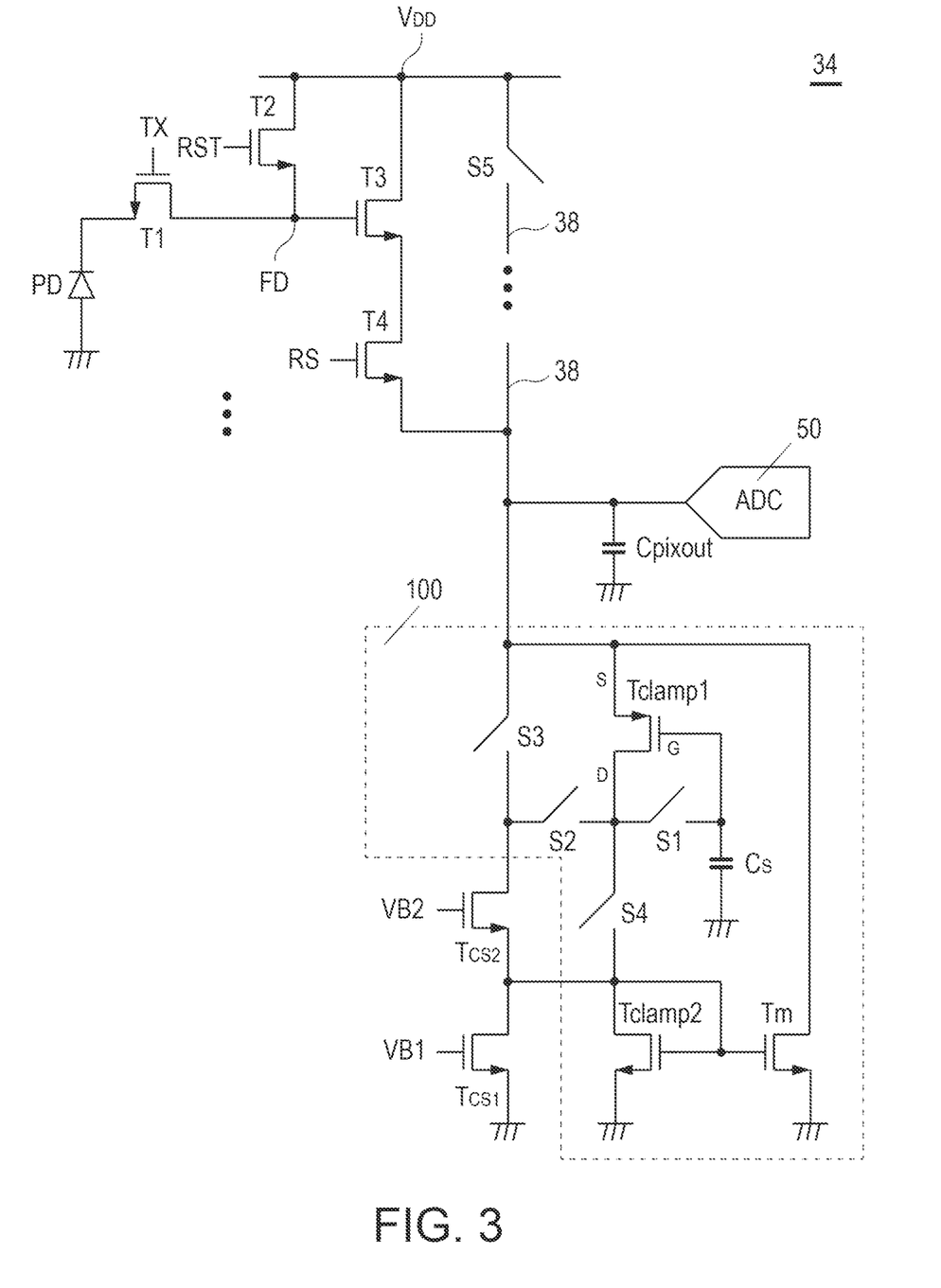
FIG. 3 is a diagram of a column of image sensor pixels coupled to illustrative active clamping circuitry in accordance with some embodiments.

FIG. 3 is a diagram of a column of image sensor pixels coupled to illustrative active clamping circuitry in accordance with some embodiments. As shown in FIG. 3, an image sensor pixel such as pixel 34 may include a photosensitive element such as a photodiode PD and a charge transfer transistor such as charge transfer transistor T1 having a first source-drain terminal coupled to photodiode PD, a second source-drain terminal coupled to floating diffusion node FD, and a gate terminal configured to receive charge transfer control signal TX. Charge transfer transistor T1 is sometimes referred to as a charge transfer gate. Floating diffusion node FD is sometimes referred to as a floating diffusion region.

Pixel 34 may further include a reset transistor T2 having a drain terminal coupled to a positive power supply line (e.g., a power supply terminal on which positive power supply voltage VDD is provided), a source terminal coupled to floating diffusion node FD, and a gate terminal configured to receive a reset control signal RST. The terms "source" terminal and "drain" terminal when referring to current-conducting terminals of a metal-oxide semiconducting transistor can be used interchangeably and are sometimes referred to as "source-drain" terminals.

Pixel 34 may also include a source follower transistor T3 having a drain terminal coupled to the positive power supply line, a gate terminal coupled to floating diffusion node FD, and a source terminal. Source follower transistor T3 is sometimes simply referred to as the "source follower." Pixel 34 may further including a row select transistor T4 having a drain terminal coupled to the source terminal of source follower T3, a gate terminal configured to receive a row select control signal RS, and a source terminal coupled to a corresponding column line 38. Transistors T1-T4 may all be n-type metal-oxide semiconductor (NMOS) transistors (e.g., n-channel devices). Although only one pixel 34 shown in FIG. 3, any number of pixels 34 may be coupled to column line 38 for readout. For example, column line 38 may be coupled to more than 10 pixels in the column, 10-100 pixels in the column, hundreds of pixels in the column, or thousands of pixels in the column. Column line 38 is sometimes referred to as a pixel output line or a pixel output column line.

Pixel output line 38 may be coupled to a corresponding analog-to-digital converter (ADC) circuit 50 that is configured to convert an analog signal read out from a selected signal to its digital equivalent. ADC circuit 50 may be considered part of column readout circuitry 42 (see FIG. 2). The total amount of capacitance on the pixel output line 38 may be represented by capacitance Cpixout, which can be fairly high depending on the number of pixels 34 attached. As described in the Background Section, if care is not taken, feedthrough from the transfer gate in the presence of high pixel output capacitance Cpixout can reduce frame rate in low light conditions.

To help improve the frame rate in low light conditions, pixel output line 38 may be coupled to an active clamp such as active clamping circuitry 100. Still referring to FIG. 3, output line 38 may be coupled to a ground line via transistors Tcs1 and Tcs2. Transistors Tcs1 and Tcs2 may serve as cascode current source transistors. Current source transistor Tcs1 has a source terminal coupled to a ground line (e.g., a ground power supply line on which a ground power supply voltage is provided), a gate terminal configured to receive a first bias voltage VB1, and a drain terminal. Cascode current source transistor Tcs2 has a source terminal coupled to the drain terminal of transistor Tcs1, a gate terminal configured to receive a second bias voltage VB2, and a drain terminal coupled to pixel output line 38.

Active clamping circuitry 100 may include a first clamping transistor Tclamp1, a second clamping transistor Tclamp2, switches S1-S5, a sampling capacitor Cs, and an optional current multiplier transistor Tm. First clamping transistor Tclamp1 may be a p-type metal-oxide-semiconductor (PMOS) transistor (e.g., a p-channel device) having a source terminal coupled to pixel output line 38, a gate terminal coupled to sampling capacitor Cs, and a drain terminal. The first switch S1 may be coupled between the gate and drain terminals of transistor Tclamp1. The second switch S2 may be coupled between the drain terminal of transistor Tclamp1 and the drain terminal of transistor Tcs2. The third switch S3 may be coupled between pixel output line 38 and the drain terminal of transistor Tcs2. The fourth switch S4 may be coupled between the drain terminal of transistor Tclamp1 and the drain terminal of transistor Tcs1. The fifth switch S5 is optional and may be coupled between the pixel output line 38 and the positive power supply line. Fifth switch S5 may be selectively activated to precharge pixel output line 38 to supply voltage VDD.

The second clamping transistor Tclamp2 may have a drain terminal coupled to the drain terminal of transistor Tcs1, a source terminal coupled to ground, and a gate terminal coupled to the drain terminal of transistor Tcs1. Transistor Tm may have a gate terminal coupled to the gate terminal of second clamping transistor Tclamp2, a source terminal coupled to ground, and a drain terminal coupled to the source terminal of first clamping transistor Tclamp1.

Bias voltages VB1 and VB2 should be at levels that bias transistors Tcs1 and Tcs2 in the saturation region during normal operation. The drain-to-source voltage across transistor Tcs1 is typically only a few hundred millivolts, which might be less than the threshold voltage of transistors Tclamp2 and Tm. Transistor Tcs1, Tcs2, Tclamp2 and Tm may all be NMOS devices.

Figure 4:
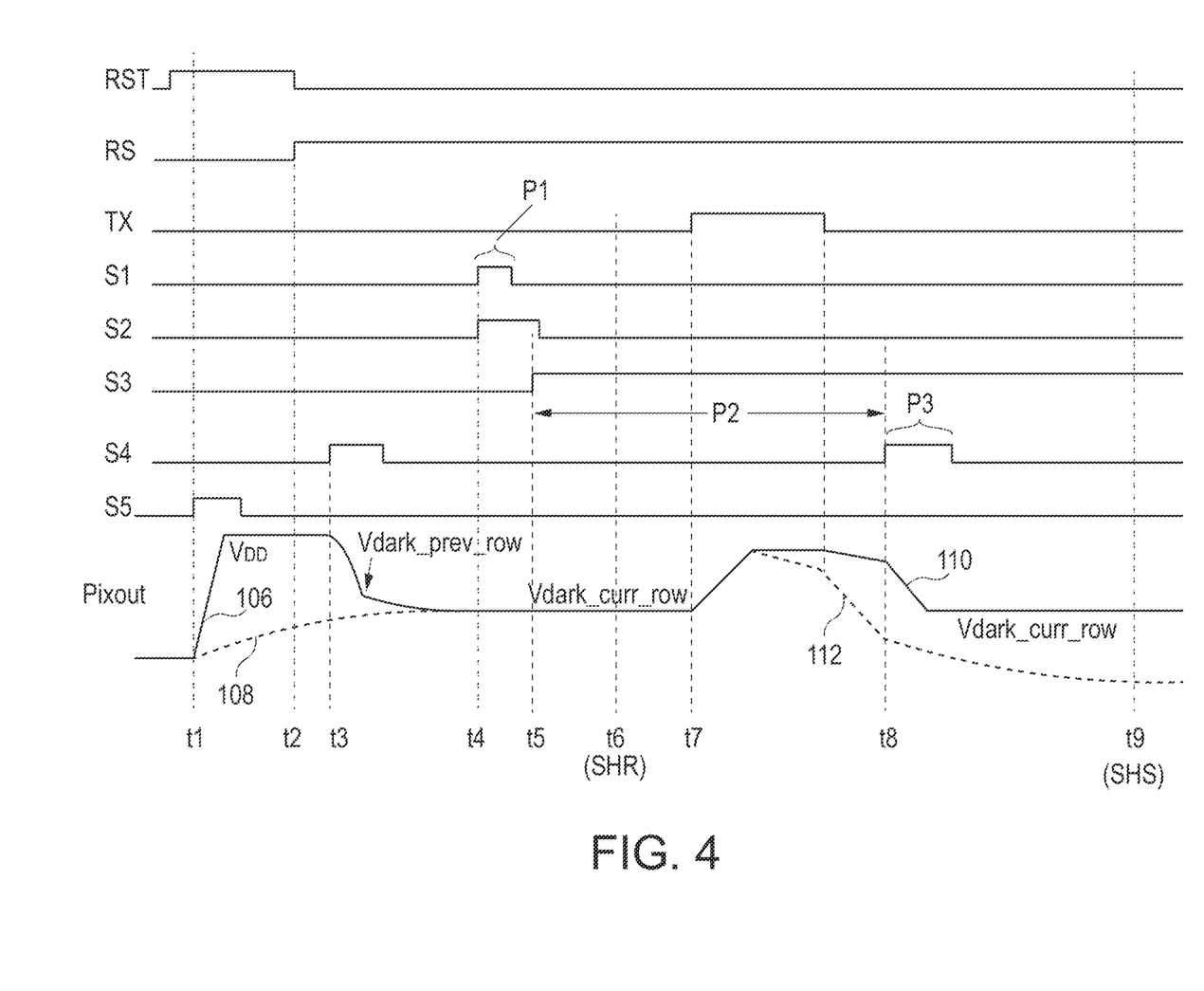
FIG. 4 is a timing diagram illustrating the operation of an image sensor pixel and active clamping circuitry of the type shown in FIG. 3 in accordance with some embodiments.

An illustrative operation of image sensor pixel 34 and active clamping circuitry 100 is shown in FIG. 4. Prior to time t5, reset control signal RST may be pulsed high to activate (turn on) reset transistor T2 (e.g., to reset the floating diffusion region FD to supply voltage VDD). During the reset operation, switch S5, if present, may be turned on to precharge the output line 38 (see the Pixout waveform at time t1) to supply level VDD. Waveform 106 represents the behavior of Pixout if switch S5 is used to precharge pixel output line 38. Waveform 108 illustrates the behavior of Pixout if switch S5 is omitted.

At time t2, row select signal RS may be driven high to active (turn on) row select transistor T4. When row select transistor T4 is turned on, voltage Pixout may track the behavior of the source follower T3 in the selected pixel 34.

At time t3, switch S4 may be temporarily activated (turned on), as shown by the S4 pulse. Turning on switch S4 may cause voltage Pixout to be driven down to a dark voltage level from the previous row (see Vdark_prev_row) by sinking current from line 38 through switches Tclamp1, S4, and Tclamp2. Switch S4 may be subsequently deactivated (turned off) prior to time t4. If switch S5 is omitted, switch S4 can be kept deactivated (i.e., maintained in the off state) at time t3. Prior to time t4, the voltage level of Pixout may settle to the dark voltage level of the current row (see Vdark_curr_row). The example of FIG. 4 in which Vdark_prev_row is shown to be higher than Vdark_current_row is merely illustrative. As another example, Vdark_prev_row may be equal or lower than Vdark_curr_row.

Figure 5A:
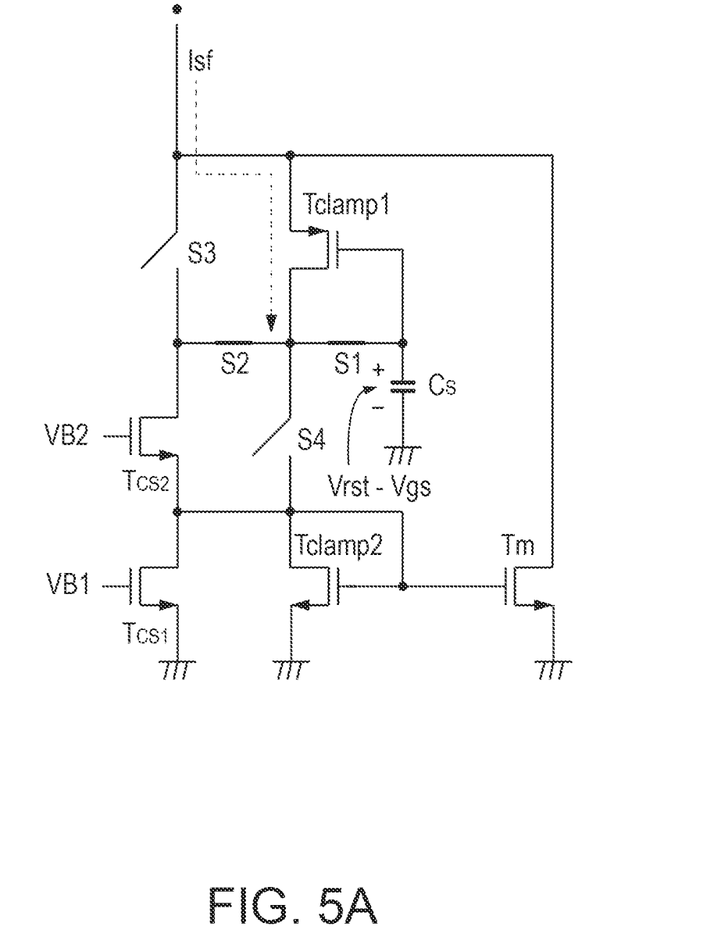
FIG. 5A is a circuit diagram illustrating a first phase of operation of the active clamping circuitry in accordance with some embodiments.

At time t4, switches S1 and S2 may be activated (turned on), as shown by the S1 and S2 pulses. FIG. 5A illustrates a snapshot of the pixel and clamping circuitry during this phase of operation (denoted as first phase P1 in FIG. 4). When switches S1 and S2 are turned on, the source follower current Isf is allowed to flow through first clamping transistor Tclamp1 to charge up sampling capacitor Cs. In other words, the source follower bias current is diverted through the diode-connected p-channel transistor Tclamp1 (since switch S1 is in the on state).

At the end of phase P1, the gate voltage of transistor Tclamp1 will be sampled across capacitor Cs, which may be equal to Vrst−Vgs. Vrst corresponds to the reset voltage level, whereas Vgs is the gate-to-source voltage drop across transistor Tclamp1 at the current set by Tcs1. Phase P1 is therefore sometimes referred to as a reset voltage sampling phase. The extra Vgs drop from transistor Tclamp1 is not a problem during the reset phase because the reset value is typically fairly high. The voltage across transistor Tcs1 is small enough to ensure that transistors Tclamp2 and Tm are both in the off state during phase P1. Switch S1 is subsequently turned off prior to time t5 to end phase P1.

Figure 5B:
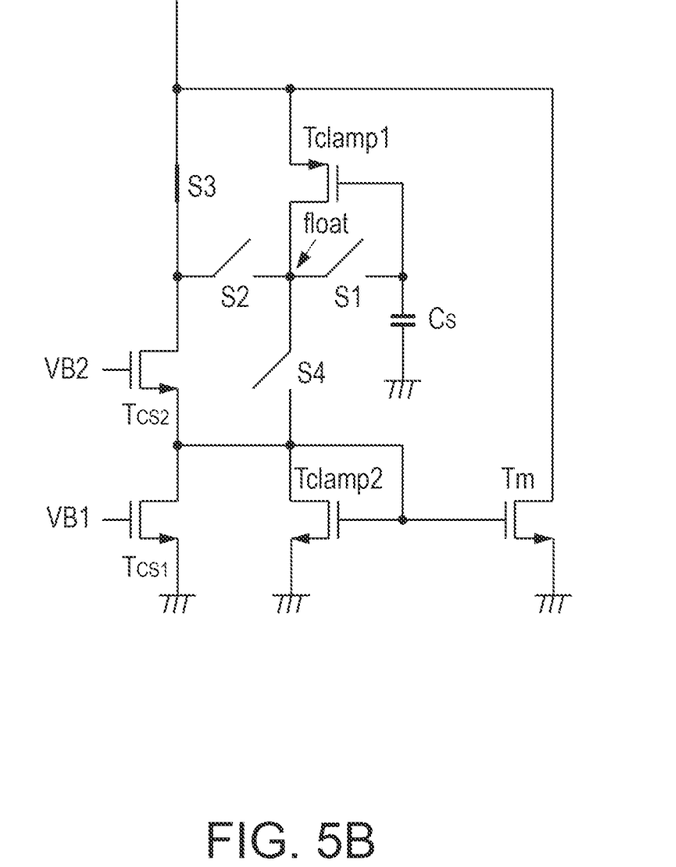
FIG. 5B is a circuit diagram illustrating a second phase of operation of the active clamping circuitry in accordance with some embodiments.

At time t5, switch S3 is activated (turned on) and then switch S2 is deactivated (turned off). FIG. 5B illustrates a snapshot of the pixel and clamping circuitry during this phase of operation (denoted as second phase P2 in FIG. 4). Since switches S1, S2, and S4 are all deactivated, the drain terminal of transistor Tclamp1 will be electrically floating. Capacitor Cs will hold/maintain the gate voltage of transistor Tclamp1 at the previously sampled reset voltage level. Since the drain terminal of transistor Tclamp1 is floating, transistor Tclamp1 no longer passes any bias current.

During phase P2, the reset value may be sampled by ADC 50 at time t6 to obtain a corresponding sample-and-hold reset (SHR) value. At time t7 (still considered part of phase P2), charge transfer control signal TX is pulsed high to transfer any accumulated charge from photodiode PD to floating diffusion region FD. Under dark (low light) conditions, the Pixout voltage will rise due to the parasitic feedthrough from the charge transfer gate (see, e.g., low light waveform 110). Signal TX is later pulled low prior to time t8.

Figure 5C:
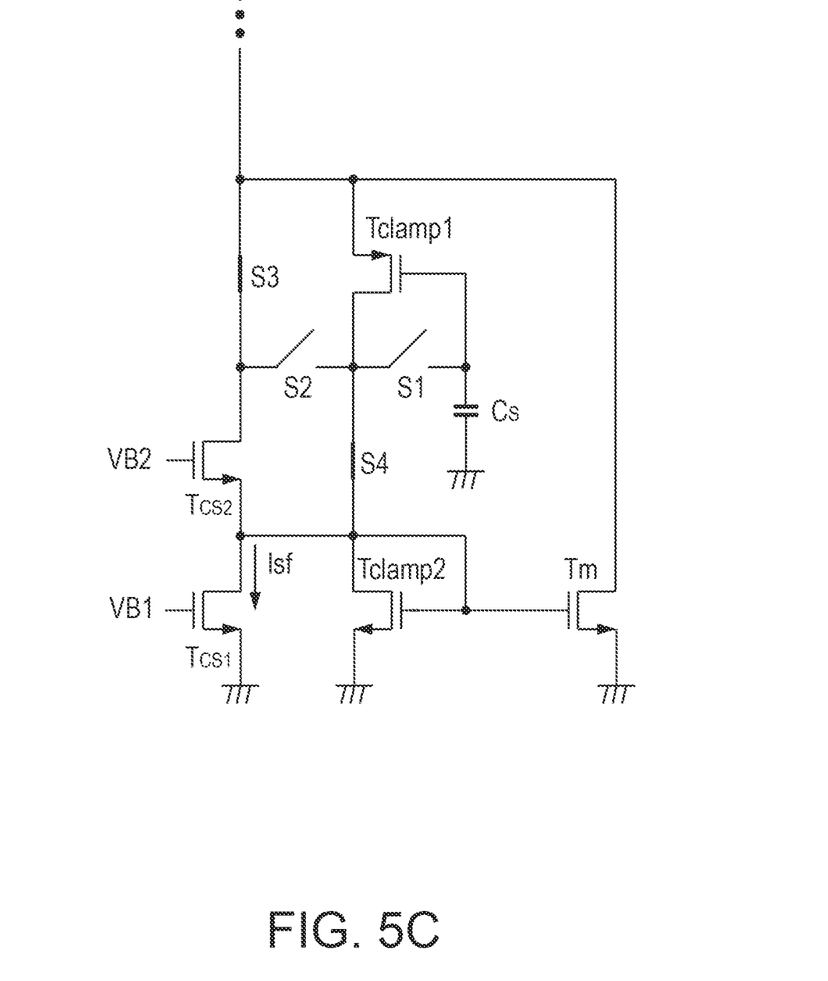
FIG. 5C is a circuit diagram illustrating a third phase of operation of the active clamping circuitry in accordance with some embodiments.

At time t8, switch S4 is activated (turned on) to enable clamping circuitry 100. FIG. 5C illustrates a snapshot of the pixel and clamping circuitry during this phase of operation (denoted as third phase P3 in FIG. 4). Switches S3 and S4 are both activated during phase P3. If the source follower output voltage (i.e., the voltage at the source terminal of source follower transistor T3) is higher than the reset value, the sum of the currents through transistors Tcs2 and Tclamp1 will exceed the source follower current Isf flowing through transistor Tcs1. This causes the voltage at the drain of transistor Tcs1 to rise, which will then turn on transistors Tclamp2 and Tm. Activating transistors Tclamp2 and Tm will cause any excess charge at output line 38 to quickly discharge until the Pixout voltage falls back to its prior level during the start of phase P2. Transistor Tm may be sized relatively larger than transistor Tclamp2 to optionally increase the amount of current being sunk and mirrored through transistor Tm. Transistor Tm is therefore sometimes referred to as a gain/transconductance multiplier transistor. The ratio of the size of Tm to Tclamp2 determines the amount of gain provided by transistor Tm.

Since pixel output line 38 has relatively high capacitance compared to other nodes, the dominant pole will be at line 38, so the overall circuit will suffer no overshoot or ringing. Clamping circuit 100 will have little effect on the Pixout waveform under bright light conditions (see, e.g., bright light waveform 112). After phase P3, the Pixout waveform should be driven down to a dark voltage level of the current row (see Vdark_curr_row). At time t9, the image signal value may be sampled by ADC 50 to obtain a corresponding sample-and-hold signal (SHS) value.

Arranged and operated in this way, active clamping circuitry 100 can be used to quickly discharge the pixel output line 38 to not more than the initial SHR value after the TX gate is asserted (see fast settling time in waveform 110 following time t8). This clamping scheme does not require any external bias voltage or current and has no added power consumption since the clamp is only enabled after the TX pulse and discharges Pixout only when there is excessive charge above the reset level. For dark or low light conditions, this technique dramatically improves the settling time while also reducing read noise and column fixed pattern noise.

Besides using active clamping circuitry 100 to speed up settling time of Pixout after the TX gate pulse, circuitry 100 can also be used to speed up the settling time of the reset value at the beginning of a new row readout by clamping Pixout to the previous row's value after precharging Pixout to the supply voltage. This is already illustrated in FIG. 4 where switch S5 is asserted at time t1 to precharge the output line 38 to the supply voltage Vdd and S4 is asserted at time t3 towards the beginning of a new row readout to reset Pixout to voltage Vdark_prev_row. The pixel reset values may vary from row to row, but they will be close enough to the previous row's value to serve as a good starting point for the current row. This will help reduce the setting time for the reset sampling as well, while further eliminating any residual column fixed pattern noise.

In some embodiments, an image sensor is provided that includes an image sensor pixel, a pixel output line coupled to the image sensor pixel, a current source transistor having a drain terminal coupled to the pixel output line and a source terminal coupled to a ground line, and clamping circuitry having: a first clamping transistor having a source terminal coupled to the pixel output line, a gate terminal, and a drain terminal; a sampling capacitor coupled to the gate terminal of the first clamping transistor; and a second clamping transistor having a drain terminal coupled to the drain terminal of the current source transistor, a gate terminal, and source terminal coupled to the ground line. The clamping circuitry can further include a first switch coupled between the drain and gate terminals of the first clamping transistor, a second switch coupled between the drain terminal of the first clamping transistor and the drain terminal of the current source transistor, a third switch coupled between the pixel output line and the second drain terminal of the current source transistor, and a fourth switch coupled between the drain terminal of the first clamping transistor and the drain terminal of the second clamping transistor.

In some embodiments, a method of operating an image sensor is provided that includes: resetting a pixel coupled to a column output line, sampling a voltage at a gate terminal of a first clamping transistor coupled to the column output line, performing a charge transfer operation in the pixel, and using the first clamping transistor and a second clamping transistor to pull down the column output line after the charge transfer operation (e.g., by turning on a switch between the first clamping transistor and the second clamping transistor). The switch can also be activated after resetting the pixel and before the charge transfer operation. The method can further include coupling the pixel output line to at least one current source transistor via the first clamping transistor while sampling the voltage at the gate terminal of the first clamping transistor. The method can further include using the first clamping transistor and the second clamping transistor to pull down the column output line after resetting the pixel and before sampling the voltage at the gate terminal of the first clamping transistor.

In some embodiment, an apparatus is provide that includes: a pixel having a photodiode, a charge transfer transistor, a reset transistor, and a source follower transistor, wherein the charge transfer transistor is activated during a charge transfer operation; an output line coupled to the source follower transistor; and clamping circuitry coupled to the output line. The clamping circuitry can include first and second clamping transistors that are used to pull down the output line after the charge transfer operation. The output line can be coupled to at least one current source transistor. The clamping circuitry can further include first and second switches that are used to sample a voltage at a gate terminal of the first clamping transistor, a third switch that is activated to connect the output line to the at least one current source transistor and deactivated to disconnect the output line from the at least one current source transistor, and a fourth switch coupled between the first and second clamping transistors. The first and second switches are activated during a sampling operation. The fourth switch is turned on after a pixel reset operation and before the sampling operation.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an image sensor pixel;
   a pixel output line coupled to the image sensor pixel;
   a current source transistor having a drain terminal coupled to the pixel output line and having a source terminal coupled to a ground line; and
   clamping circuitry having:
      a first clamping transistor having a source terminal, a gate terminal, and a drain terminal, the source terminal of the first clamping transistor being coupled to the pixel output line;
      a sampling capacitor coupled to the gate terminal of the first clamping transistor; and
      a second clamping transistor having a drain terminal, a gate terminal, and a source terminal, the drain terminal of the second clamping transistor being coupled to the drain terminal of the current source transistor and the source terminal of the second clamping transistor being coupled to the ground line.

2. The image sensor of claim 1, wherein the clamping circuitry comprises:
   a first switch coupled between the drain and gate terminals of the first clamping transistor;
   a second switch coupled between the drain terminal of the first clamping transistor and the drain terminal of the current source transistor;
   a third switch coupled between the pixel output line and the second drain terminal of the current source transistor;
   a fourth switch coupled between the drain terminal of the first clamping transistor and the drain terminal of the second clamping transistor; and
   a fifth switch coupled between the pixel output line and the positive supply voltage line.

3. The image sensor of claim 1, wherein the first clamping transistor has a first channel type and wherein the second clamping transistor has a second channel type different than the first channel type.

4. The image sensor of claim 3, wherein the first clamping transistor is a p-channel transistor and wherein the second clamping transistor is an n-channel transistor.

5. The image sensor of claim 1, further comprising:
an additional current source transistor having a drain terminal coupled to the pixel output line, a gate terminal, and a source terminal coupled to the drain terminal of the current source transistor.

6. The image sensor of claim 5, wherein the clamping transistor comprises:
a first switch having a first terminal coupled to the gate terminal of the first clamping transistor and having a second terminal coupled to the drain terminal of the first clamping transistor.

7. The image sensor of claim 6, wherein the clamping transistor comprises:
a second switch having a first terminal coupled to the drain terminal of the first clamping transistor and having a second terminal coupled to the drain terminal of the additional current source transistor.

8. The image sensor of claim 7, wherein the clamping transistor comprises:
a third switch having a first terminal coupled to the pixel output line and having a second terminal coupled to the second terminal of the second switch.

9. The image sensor of claim 8, wherein the clamping transistor comprises:
a fourth switch having a first terminal coupled to the drain terminal of the first clamping transistor and having a second terminal coupled to the drain terminal of the second clamping transistor.

10. The image sensor of claim 9, wherein the clamping transistor comprises:
a gain multiplier transistor having a gate terminal coupled to the gate terminal of the second clamping transistor, a source terminal coupled to the ground line, and the drain terminal coupled to the pixel output line.

11. A method of operating an image sensor, comprising:
resetting a pixel, wherein the pixel is coupled to a column output line;
sampling a voltage at a gate terminal of a first clamping transistor coupled to the column output line;
performing a charge transfer operation in the pixel; and
using the first clamping transistor and a second clamping transistor to pull down the column output line after the charge transfer operation.

12. The method of claim 11, wherein using the first clamping transistor and the second clamping transistor to pull down the column output line after the charge transfer operation comprises turning on a switch between the first clamping transistor and the second clamping transistor.

13. The method of claim 12, further comprising:
activating the switch after resetting the pixel and before the charge transfer operation.

14. The method of claim 11, further comprising:
coupling the pixel output line to at least one current source transistor via the first clamping transistor while sampling the voltage at the gate terminal of the first clamping transistor.

15. The method of claim 14, further comprising:
after sampling the voltage at the gate terminal of the first clamping transistor and before performing the charge transfer operation, electrically floating a drain terminal of the first clamping transistor.

16. The method of claim 11, further comprising:
after resetting the pixel and before sampling the voltage at the gate terminal of the first clamping transistor, using the first clamping transistor and the second clamping transistor to pull down the column output line.

17. An apparatus comprising:
a pixel having a photodiode, a charge transfer transistor, a reset transistor, and a source follower transistor, wherein the charge transfer transistor is activated during a charge transfer operation;
an output line coupled to the source follower transistor; and
clamping circuitry coupled to the output line, wherein the clamping circuitry comprises first and second clamping transistors, and wherein the first clamping transistor comprises
a first source-drain terminal coupled to the output line,
a gate terminal coupled to a capacitor, and
a second source-drain terminal coupled to the second clamping transistor.

18. The apparatus of claim 17, further comprising:
at least one current source transistor coupled to the output line, wherein the clamping circuitry comprises:
first and second switches that are used to sample a voltage at a gate terminal of the first clamping transistor; and
a third switch that is activated to connect the output line to the at least one current source transistor and deactivated to disconnect the output line from the at least one current source transistor.

19. The apparatus of claim 18, wherein the clamping circuitry comprises:
a fourth switch coupled between the first and second clamping transistors.

20. The apparatus of claim 19, wherein:
the reset transistor is activated during a reset operation;
the first and second switches are activated during a sampling operation; and
the fourth switch is turned on after the reset operation and before the sampling operation.

* * * * *